United States Patent [19]
Akagiri

[11] Patent Number: 5,311,561
[45] Date of Patent: May 10, 1994

[54] METHOD AND APPARATUS FOR COMPRESSING A DIGITAL INPUT SIGNAL WITH BLOCK FLOCATING APPLIED TO BLOCKS CORRESPONDING TO FRACTIONS OF A CRITICAL BAND OR TO MULTIPLE CRITICAL BANDS

[75] Inventor: Kenzo Akagiri, Kanagawa, Japan

[73] Assignee: Sony Corporation, Tokyo, Japan

[21] Appl. No.: 857,774

[22] Filed: Mar. 26, 1992

[30] Foreign Application Priority Data

Mar. 29, 1991 [JP] Japan .................................. 3-091187
Mar. 29, 1991 [JP] Japan .................................. 3-091188

[51] Int. Cl.$^5$ .............................................. H04B 1/66
[52] U.S. Cl. .................................... 375/122; 395/2.13
[58] Field of Search ........................... 375/25, 122, 27;
358/13, 133; 341/143; 381/29, 31; 395/2.13

[56] References Cited

U.S. PATENT DOCUMENTS 5,117,228  5/1992  Fuchigami et al. ................... 381/46
5,134,475  7/1992  Johnston et al. ....................... 375/27

Primary Examiner—Stephen Chin
Assistant Examiner—Tesfaldet Bocure
Attorney, Agent, or Firm—Limbach & Limbach

[57] ABSTRACT

A method for compressing a digital input signal to provide a compressed signal in which spectral components are derived from the digital input signal and are divided into critical bands. The spectral components at lower frequencies are also divided into a block having a bandwidth corresponding to that of plural critical bands. Block floating processing is applied to the block to generate a floating coefficient. Finally, the spectral components in each critical band are quantized using an adaptively-allocated number of bits. Additionally, the word length indicating the number of bits allocated for quantizing the spectral components in each critical band is included in the compressed signal together with the floating coefficient for the block as the only floating coefficient for the critical bands in the block. This reduces the number of bits in the compressed signal. The spectral components in a higher-frequency critical band are divided into blocks having a bandwidth that is narrower than the bandwidth of the critical band. Block floating processing is applied to the blocks to generate a floating coefficient for each block. Finally, the spectral components in each block are quantized using an adaptively-allocated number of bits. The word length for each block is included in the compressed signal together with, instead of the floating coefficient for each block, the allowed noise level for the critical band.

50 Claims, 7 Drawing Sheets

METHOD AND APPARATUS FOR COMPRESSING A DIGITAL INPUT SIGNAL WITH BLOCK FLOATING APPLIED TO BLOCKS CORRESPONDING TO FRACTIONS OF A CRITICAL BAND OR TO MULTIPLE CRITICAL BANDS

TITLE OF THE INVENTION

Method and Apparatus for Compressing a Digital Input Signal With Block Floating Applied to Blocks Corresponding to Fractions of a Critical Band or to Multiple Critical Bands

BACKGROUND OF THE INVENTION

1. Field of the Invention

This invention relates to a method and apparatus for compressing a digital audio signal in which the amount of subinformation in the compressed signal is reduced.

2. Prior Art

For compressing a digital audio signal or sound signal, etc., known coding technologies based on bit allocation divide the digital audio or sound signal, etc. into signal components in plural blocks in the time domain or the frequency domain, and adaptively allocate a number of quantizing bits to each block. Among the coding technologies based on bit allocation there is, for example, sub-band coding (SBC), in which a digital audio signal in the time domain is divided into spectral components in plural frequency bands and the spectral components are then quantized. There is also adaptive transform coding (ATC) that orthogonally transforms a digital audio signal in the time domain into the frequency domain to divide the signal into spectral components in plural frequency bands. The spectral components in each frequency band are then adaptively quantized. There is also adaptive bit allocation (APC-AB) coding in which sub-band coding and adaptive predictive coding (APC) are combined to divide a digital audio signal in the time domain into spectral components in frequency bands. The spectral components in the frequency bands are then converted to spectral components in base bands, and a linear predictive analysis of plural orders is carried out to provide predictive coding.

As a further example, blocks obtained by dividing a digital audio signal in time are transformed into the frequency domain by an orthogonal transform, such as a fast Fourier transform (FFT) or a discrete cosine transform (DCT). The resulting spectral components are divided into plural bands, and the spectral components in each band are quantized by the adaptive bit allocation. The quantized spectral components are then included in the compressed signal.

An approach frequently employed in quantizing the bands of spectral components using adaptive bit allocation divides the spectral components into blocks and applies block floating processing to each block to further increase data compression. Because of this, and the configuration of the complementary expander, the compressed signal also includes subinformation comprising a floating coefficient for each block, and a word length corresponding to each floating coefficient and indicating the number of bits allocated for quantizing the spectral components in the block.

However, it is desirable to further increase the amount of signal compression provided by the above-mentioned compression scheme.

SUMMARY OF THE INVENTION

With the above-described circumstances in view, the present invention has been proposed, and its object is to provide a method for compressing a digital signal, which is capable of providing a greater degree of compression.

In a first method according to the invention for compressing a digital input signal to provide a compressed signal, spectral components are derived from the digital input signal and are divided into critical bands. The spectral components in a critical band are divided into blocks having a bandwidth narrower than the bandwidth of the critical band. Block floating processing is applied to the blocks to generate a floating coefficient for each block. The spectral components in each block are quantized using a number of bits allocated to the block according to an allowed noise level for the critical band. The number of bits allocated is indicated by a word length. Finally, the word length for each block is included in the compressed signal together with, instead of the floating coefficient for each block, the allowed noise level for the critical band.

A corresponding apparatus according to the invention is for compressing a digital input signal to provide a compressed signal and comprises an orthogonal transform circuit whereto the input signal is connected. The apparatus additionally comprises a circuit for dividing spectral components from the orthogonal transform circuit into critical bands, a circuit for dividing the spectral components in a critical band into blocks having a bandwidth narrower than the critical band, a circuit for applying block floating processing to the blocks to generate a floating coefficient for each block, and a circuit for quantizing the spectral components in each block using a number of bits allocated to the block according to an allowed noise level for the critical band, the number of bits being indicated by a word length. Finally, the apparatus includes a circuit for including in the compressed signal the word length for each block, and, instead of the floating coefficient for each block, the allowed noise level for the critical band.

Thus, when block floating processing is applied to blocks having a bandwidth that is narrower than that of the critical band, the word length indicating the number of bits allocated for quantizing each block is included in the compressed signal. Also, the allowed noise level is included in the compressed signal instead of the floating coefficient for each block in the critical band. This reduces the number of bits in the compressed signal.

In a second method according to the invention for compressing a digital input signal to provide a compressed signal, spectral components are derived from the digital input signal and are divided into critical bands. The spectral components are also divided into a block having a bandwidth corresponding to plural critical bands. Block floating processing is applied to the block to generate a floating coefficient. Finally, the spectral components in each critical band are quantized using an adaptively-allocated number of bits.

A corresponding apparatus according to the invention is for compressing a digital input signal to provide a compressed signal. The apparatus comprises an orthogonal transform circuit whereto the digital input signal is connected. The apparatus additionally comprises a circuit for dividing spectral components from the orthogonal transform circuit into critical bands, a circuit for dividing the spectral components into a block having a bandwidth corresponding to plural critical bands, and a circuit for applying block floating processing to the block to generate a block floating coefficient. Finally, the apparatus includes a circuit for quantizing the spectral components in each critical band using an adaptively-allocated number of bits.

Also, when block floating processing is applied to a block having a bandwidth that is broader than that of a critical band, the word length indicating the number of bits allocated for quantizing the spectral components in each critical band is included in the compressed signal. Also, the floating coefficient for the block is included in the compressed signal as the only floating coefficient for the critical bands in the block. This reduces the number of bits in the compressed signal.

In a third method according to the invention for compressing a digital input signal to provide a compressed signal, spectral components are derived from the digital input signal and are divided into critical bands. The spectral components in a critical band are divided into blocks having a bandwidth that is narrower than the bandwidth of the critical band. Block floating processing is applied to the blocks to generate a floating coefficient for each block. Finally, the spectral components in each block are quantized using an adaptively-allocated number of bits.

Also, when block floating processing is applied to a block having a bandwidth that is narrower than that of the critical band, the word length indicating the number of bits allocated for quantizing the spectral components in one block in the critical bands is included in the compressed signal. On the other hand, when block floating processing is applied to a block having a bandwidth that is broader than that of the critical band, the word length for one of the critical bands in the block and the allowed noise level for each critical band in the block may be included in the compressed signal.

In the fourth method according to the invention for compressing a digital input signal to provide a compressed signal, spectral components are derived from the digital input signal and are divided into critical bands. The spectral components in a critical band are divided into blocks having a bandwidth narrower than the bandwidth of the critical band. Block floating processing is applied to the blocks to generate a floating coefficient for each block. The spectral components in each block are quantized using a number of bits allocated to the block according to an allowed noise level for the critical band. The number of bits allocated is indicated by a word length. Finally, the allowed noise level with a range that is shifted downwards in level by a predetermined level from a signal level range in the critical band is included in the compressed signal instead of the floating coefficient for each block.

Shifting the range of the allowed noise level downwards enables the allowed noise level to be expressed to a given accuracy using fewer bits, and therefore reduces the number of bits in the compressed signal. Including the downwards-shifted allowed noise level in the compressed signal instead of the floating coefficient for each block also reduces the number of bits in the compressed signal.

DESCRIPTION OF THE PREFERRED EMBODIMENT

A preferred embodiment to which this invention is applied will now be described with reference to the attached drawings.

Figure 1A:
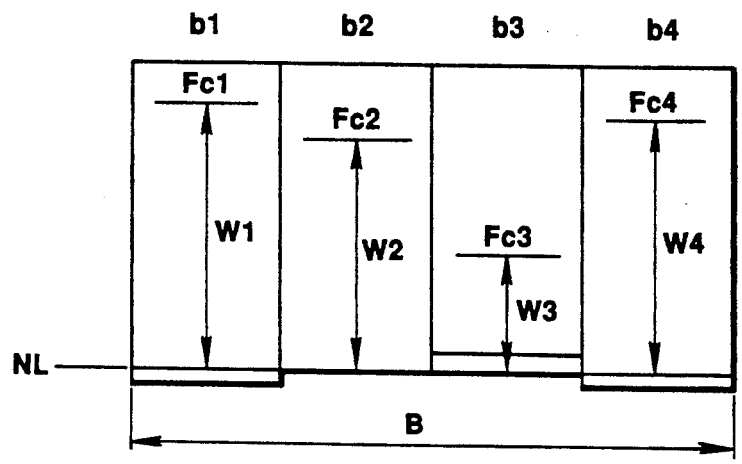
FIG. 1A shows how block floating processing is applied according to the invention to blocks having a bandwidth that is narrower than that of a critical band.
Figure 1B:
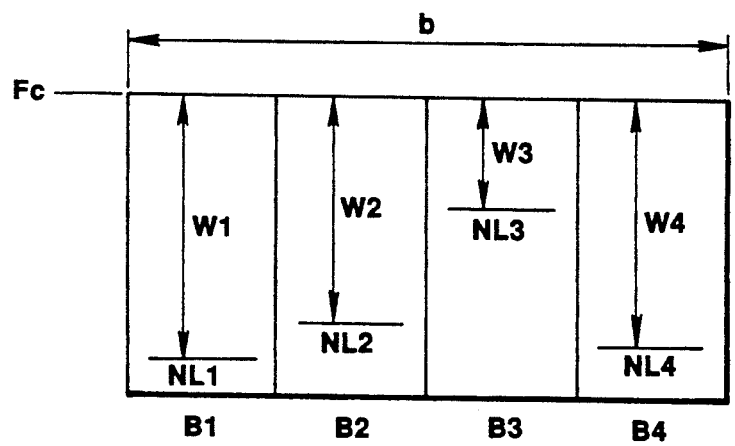
FIG. 1B shows block floating processing is applied according to the invention to a block having a bandwidth that is broader than that of a critical band.

The method for compressing a digital input signal according to the invention is directed to a method for quantizing a digital signal, as shown in FIGS. 1A and 1B. In this method, the digital input signal in the time domain is orthogonally transformed using, e.g., a fast Fourier transform (FFT) or a discrete cosine transform (DCT) to provide spectral components in the frequency domain. The spectral components are divided in frequency into plural critical bands, such as the critical band B. The critical bands have a bandwidth that broadens with increasing frequency to take account of the frequency discrimination characteristics of the human sense of hearing. The spectral components in each critical band are quantized using a number of bits allocated according to the difference between an allowed noise level NL for the critical band and the energy in the critical band. The allowed noise level is calculated from the energies in the critical bands. The spectral components are also divided into blocks, such as the block b, to which block floating processing is applied. The block floating coefficient Fc, determined for the block by the block floating processing, is also included in the compressed signal.

Figure 2:
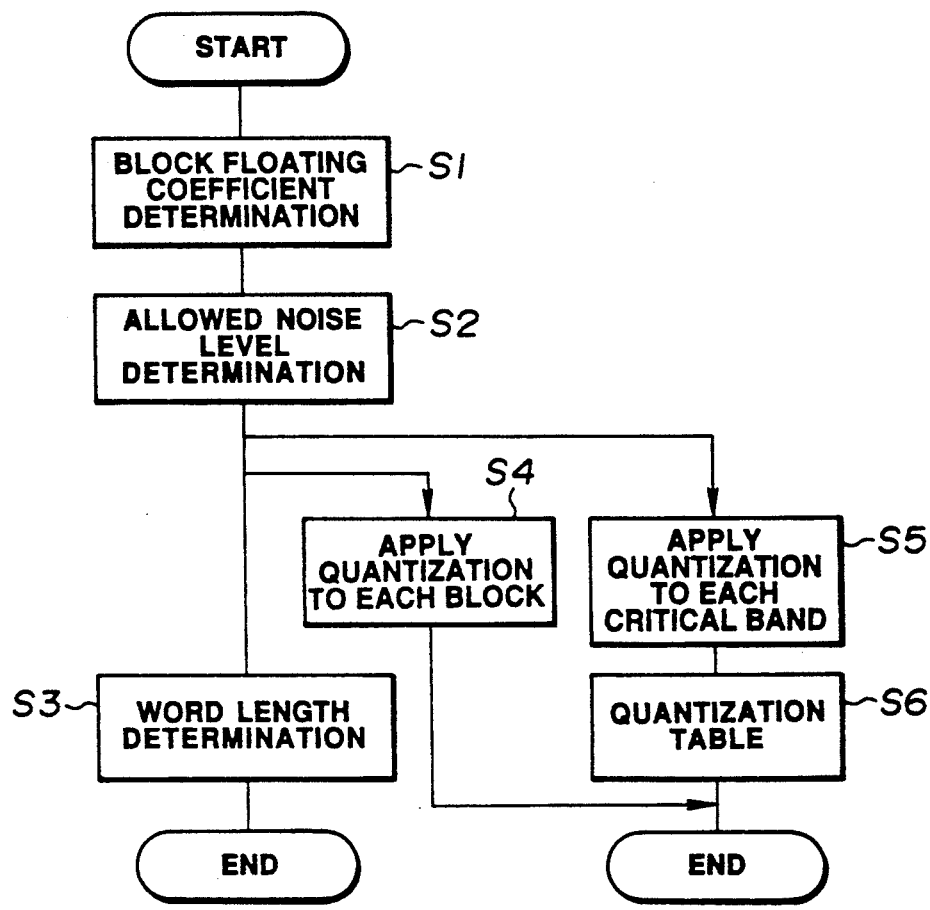
FIG. 2 is a flowchart of an embodiment of the invention.

In this embodiment, the processing shown in the flowchart of FIG. 2 is carried out. First, at step S1, the spectral components resulting from the orthogonal transform are divided into blocks to which block floating processing is applied. The block floating determines a block floating coefficient for each block. Step S2 determines an allowed noise level for each critical band in response to the energies in the critical band, as will be described in detail below. Step S3 determines, for each critical band, the word length corresponding to the number of bits allocated for quantizing the spectral components in the critical band in response to the level difference between the allowed noise level in the critical band and the energy in the critical band.

FIG. 1A shows block floating processing applied to each of the plural blocks b1 through b4 having a bandwidth narrower than that of the critical band B. The method according to the invention includes in the compressed signal the allowed noise level NL and the word lengths W1 to W4, corresponding to the numbers of bits allocated to each sub block b1 through b4, respectively, instead of the block floating coefficient of the critical band B.

FIG. 1B shows block floating processing applied to the block b having a bandwidth broader than that of the critical bands B1 through B4. The method according to the invention includes in the compressed signal the floating coefficient for the block b, and the word lengths W1 through W4, corresponding to the number of bits allocated for quantizing the spectral components in the critical bands B1 through B4, respectively.

FIG. 1A shows one higher-frequency critical band B that has a relatively broad bandwidth. FIG. 1B shows four lower-frequency critical bands, B1 through B4, that have a relatively narrow bandwidth. Because corresponding level differences are used for determining the numbers of bits allocated and the word lengths W1 through W4, the numbers of bits allocated have been omitted from FIGS. 1A and 1B to simplify the drawings.

The spectral components resulting from the orthogonal transform are quantized using adaptive bit allocation. Quantizing using adaptive bit allocation determines a so-called masking quantity that takes account of certain characteristics of the human sense of hearing, as will be described below. The masking quantity is determined from the energy in each critical band. Then, there is allocated to each band a number of quantizing bits corresponding to the level difference between an allowed noise level derived from the masking quantity (i.e., a substantially fixed allowed noise for the critical band) and the energy in the critical band. Finally, each spectral component in each critical band is quantized using the number of bits allocated for the band.

The plural spectral components in the respective critical bands are formed into blocks of a fixed number of spectral components and block floating processing is applied to the blocks to achieve additional data compression. Accordingly, as shown in FIG. 1A, there will exist plural blocks (e.g., the four blocks b1 through b4) in the higher-frequency, broad-bandwidth critical band B. Also, as shown in FIG. 1B, at lower frequencies, where the critical bands have a narrow bandwidth, there will exist plural critical bands (e.g., the four critical bands B1 through B4) in the block b.

If block floating processing is implemented as just described, the floating coefficients for the block floating processing and the word lengths corresponding to the numbers of bits that have been used to quantize the spectral components are required when the compressed signal is subsequently expanded. Because of the configuration of the expander, the compressor must conventionally include the block floating coefficient and the word length for each block in the compressed signal. The expander determines the most significant bit (MSB) of the block floating processing from the block floating coefficient, and the least significant bit (LSB) from the word length. In this way, the allowed noise levels are determined. Finally, the magnitude of the signal is determined from spectral components in each block.

Conventionally, 6 bits are allocated for each floating coefficient, and 4 bits are allocated to each word length. When the orthogonal transform is a discrete Fourier transform (DFT), the above-mentioned word lengths are such that the amplitude and the phase, or the real part and the imaginary part, are represented by 4 bits. For this reason, when one critical band is divided into plural blocks for block floating processing, the number of bits required for the entire critical band in relation to the number of blocks into which the band is divided is as shown in Table 1.

TABLE 1

| NO. OF DIVISIONS OF CRITICAL BAND | 1 | 2 | 3 | 4 |
|---|---|---|---|---|
| FLOATING COEFFICIENTS | 6 | 6 × 2 | 6 × 3 | 6 × 4 |
| WORD LENGTHS | 4 | 4 × 2 | 4 × 3 | 4 × 4 |
| TOTAL | 10 | 20 | 30 | 40 |

In Table 1, when the critical band is divided into a single block, a total of 10 bits are required, 6 bits for the floating coefficient and 4 bits for the word length. When the critical band is divided into two blocks, 20 bits are required, 6×2 (=12) bits for the floating coefficient and 4×2 (=8) bits for the word length. When the critical band is divided into three blocks, 30 bits are required, 6×3 (=18) bits for the floating coefficient and 4×3 (=12) bits for the word length. Finally, when the critical band is divided into four blocks, as shown in FIG. 1A, a total of 40 bits are required, 6×4 (=24) bits for the floating coefficient and 4×4 (=16) bits for the word length. Therefore, as the number of blocks into which a single critical band increases, the number of bits required also increases.

In contrast, the method according to the invention only requires that the allowed noise level NL for the whole of the critical band B and the word lengths W1 through W4, corresponding to the numbers of bits allocated for quantizing the spectral components in the blocks b1 through b4, respectively, be included as subinformation in the compressed signal. The method does not require that the floating coefficients Fc1 through Fc4 of the respective blocks b1 through b4 of the critical band B be included in the compressed signal. In the subsequent expansion processing, if the allowed noise level NL of the critical band B is included in the compressed signal, the floating coefficients Fc1 through Fc4 of the respective blocks b1 through b4 can be determined from the allowed noise level NL and the word lengths W1 through W4 of the respective blocks b1 through b4. This saves having to include the floating coefficients Fc1 through Fc4 in the compressed signal. Thus, the four floating coefficients Fc1 through Fc4 of the critical band B can be transmitted to the expander using fewer bits.

The allowed noise level NL is determined for each critical band in consideration of the characteristics of human sense of hearing. The allowed noise level NL can be regarded as being substantially constant within each critical band. Accordingly, the allowed noise level NL can be regarded as being the same level in each of the blocks b1 through b4 in the critical band B of FIG. 1A.

Figure 7:
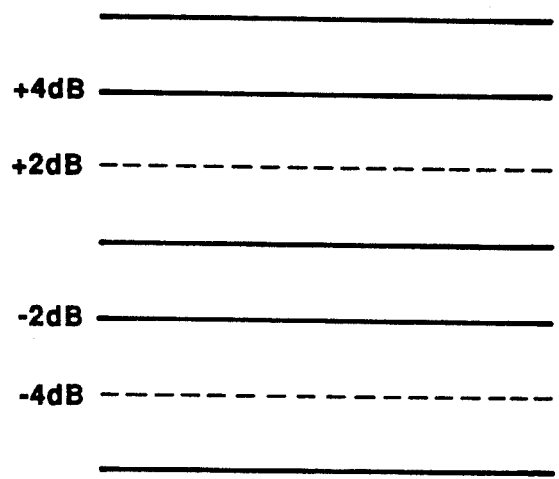
FIG. 7 shows the allowed noise levels transmitted for the respective blocks of this embodiment.

It is to be noted that when the entire dynamic range is, e.g., 120 dB, and the floating coefficient is represented by 6 bits, the floating coefficient has an accuracy of about 2 dB. It is also to be noted that when the word length is represented by 4 bits, the word length has an accuracy of about 6 dB. For this reason, in the subsequent expansion of the spectral components in the blocks b1 through b4 of FIG. 1A, the allowed noise level determined from the floating coefficients Fc1 through Fc4 and the word lengths W1 through W4 has a deviation or shift of about 2 dB, as shown in FIG. 7. However, the allowed noise level NL ordinarily falls within the range of substantially ±3B. Because of this, this embodiment applies two stage quantizing to represent the allowed noise level NL. The two-stage quantizing consists of rough quantizing common to the critical band, and fine quantizing applied to each block in the critical band. This enables the allowed noise level NL to be set as a common value with high accuracy. In this embodiment, since the allowed noise level NL is 4 bit log level, an allowed noise level NL which cannot be represented by the 4 bit log is finely represented by a 2 bit log. This divides the range of about 6 dB by four, and permits the allowed noise level to have an accuracy of 1.5 dB.

It will be re-stated here that the fact that the respective allowed noise levels NL are substantially equal over plural blocks enables a high accuracy parameter to be derived from the floating coefficients and the allowed noise level, which makes it possible to reduce the number of bits. The manner in which method according to the invention reduces the number of bits in the example of FIG. 1A is shown by comparing Table 2 with Table 1.

TABLE 2

| NO. OF SUBDIVISIONS OF CRITICAL BAND | 1 | 2 | 3 | 4 |
|---|---|---|---|---|
| ALLOWED NOISE LEVEL | 4+2 | 4+(2×2) | 4+(2×3) | 4+(2×4) |
| WORD LENGTHS | 4 | 4×2 | 4×3 | 4×4 |
| TOTAL | 10 | 16 | 22 | 28 |
| NO. OF BITS AS PERCENTAGE OF NO. OF BITS IN TABLE 1 | 100 | 80 | 73 | 70 |

In Table 2, when the critical band B is divided into a single block, a total of 8 bits of subinformation are required, 4 bits for the allowed noise level NL and 4 bits for the word length W. However, since an additional 2 bits are required to compensate the deviation of 2 dB in the allowed noise level, 4+2=6 bits are required for the allowed noise level, and hence a total of 10 bits of subinformation are required. When the critical band B is divided into two blocks, a total of 16 bits are required, 4+(2×2)=8 bits for the allowed noise level and 4×2=8 bits for the word length W. When the critical band B is divided into three blocks, a total of 22 bits is required, 4+(2×3)=10 bits for the allowed noise level NL and 4×3=12 bits for the word length W. Finally, when the critical band B is divided into four blocks, as in the example shown in FIG. 1A, a total of 28 bits is required, 4+(2×4)=12 bits for the allowed noise level NL and 4×4=16 bits for the word length W.

Compared with the numbers of bits required in the corresponding examples shown in Table 1, the bit requirement shown in Table 2 is equal to 100% when the critical band is divided into one block. However, as the number of blocks into which the critical band is divided increases, the bit requirement shown in Table 2 is reduced. The bit requirement is reduced to 80% when the band is divided into two blocks, to 73% when the band is divided into three blocks, and to 70% when the band is divided into four blocks. From this, it can be seen that the method of this aspect of the invention is very effective in reducing the number of bits of subinformation required.

It is to be noted that quantization of the word lengths W1 through W4 is uniform, not adaptive.

In the example shown in FIG. 1A, the number of bits may be alternatively reduced by including in the compressed signal only the word length W1 of the word lengths W1 through W4 of the critical band B. The other word lengths W2 through W4 can be omitted. In this case, the compressed signal includes the respective floating coefficients Fc1 through Fc4 of the critical band B, and the word length W1. In the subsequent expansion processing, if the compressed signal includes one word length, the remaining word lengths W2 through W4 can be determined from the respective floating coefficients Fc1 through Fc4. The allowed noise level NL can be determined from the floating coefficient Fc1 and the word length W1, and the remaining word lengths W2 through W4 can be found from the allowed noise level NL and the floating coefficients Fc2 through Fc4. Hence, the number of bits of subinformation may be reduced by omitting the word lengths W2 through W4 from the compressed signal. This reduces the number of bits of subinformation required in the compressed signal to represent the three word lengths W2 through W4 in the critical band B.

When block floating processing is applied to a block having a bandwidth corresponding to that of the critical band, the block floating coefficient for each critical band and the word length for each critical band would conventionally be included in the compressed signal. The method according to the invention applies block floating to a block b having a bandwidth that is broader than that of a critical band and includes the floating coefficient Fc for the block b and the word lengths W1 through W4 for the critical bands B1 through B4, respectively, of the block b, as shown in FIG. 1B, in the compressed signal as subinformation.

The allowed noise levels NL1 through NL4 of the respective critical bands B1 through B4 are omitted from the compressed signal. Because the floating coefficients Fc are equal to each other in the critical bands B1 through B4, the allowed noise levels NL1 through NL4 can be determined from one floating coefficient Fc and the word lengths W1 through W4 of the respective critical bands B1 though B4. Therefore, by including only the floating coefficient Fc and the word lengths W1 through W4 in the compressed signal as subinformation, the number of bits of subinformation can be further reduced.

The manner in which the method reduces the number of bits in the example of FIG. 1B is shown by comparing Table 3 with Table 1.

TABLE 3

| NO. OF CRITICAL BANDS IN BLOCK | 1 BANDS | 2 BANDS | 3 BANDS | 4 BANDS |
|---|---|---|---|---|
| FLOATING COEFFICIENT | 6 | 6 | 6 | 6 |
| WORD LENGTHS | 4 | 4 × 2 | 4 × 3 | 4 × 4 |
| TOTAL | 10 | 14 | 18 | 22 |
| NO. OF BITS AS PERCENTAGE OF NO. OF BITS IN TABLE 1 | 100 | 70 | 60 | 55 |

Table 3 will explained in terms of the number of critical bands in the block b. When the block b contains 1 critical band, a total of 10 bits of subinformation are required, 6 bits for the floating coefficient Fc and 4 bits for the word length W. When the block b contains two critical bands, a total of 14 bits are required, 6 bits for the floating coefficient Fc and 4×2=8 bits for the word length W. When the block contains three critical bands, a total of 18 bits are required, 6 bits for the floating coefficient Fc and 4×3=12 bits for the word length W. Finally, when the block contains four bands, as shown in FIG. 1B, a total of 22 bits is required, 6 bits for the floating coefficient Fc and 4×4=16 bits for the word length.

As a result, compared with the numbers of bits required in the examples shown in Table 1, when the block b contains 1 critical band, the number of bits shown in Table 3 is 100%, i.e., is the same as in the corresponding example in Table 1. However, the number of bits required is reduced compared with the example shown in Table 1 when the number of bands contained in the block increases: the bit requirement is 70% for two bands, 60% for three bands, and 55% for four bands. Accordingly, it can be seen that the method according to this aspect of the invention is very effective in reducing the number of bits of subinformation required.

According to a further aspect of the invention, when block floating processing is applied to blocks having a bandwidth that is narrower than that of a critical band, the dynamic range of the allowed noise level is shifted downwards in level. This further reduces the number of bits required for the subinformation.

At step S4 of the process shown in FIG. 2, the word lengths, corresponding to the number of bits allocated for quantizing the spectral components in each block, are determined for each critical band and included in the compressed signal. At steps S5 and S6, the allowed noise level is determined for each critical band. The range of the allowed noise level is shifted downwards from the signal level in the critical band by a predetermined level based on a masking quantity, and the shifted allowed noise level is included in the compressed signal instead of the floating coefficients. In practice, a quantizing table, in which there are stored values by which the range of the allowed noise level is shifted downwards by a predetermined level from the signal level in the critical band, is used to provide a value corresponding to the allowed noise level determined at step S2. This value is included in the compressed signal.

The range of the allowed noise level is shifted downwards because it is ineffective or useless to use the dynamic range of the signal for the range of the allowed noise level. Since the allowed noise level is determined from a masking quantity that takes account of the characteristics of the human sense of hearing, as will be described below, the allowed noise level will always have a level less than, by the predetermined level, the level of the signal. For example, the allowed noise level can be lower than the signal level by about 26 dB.

As stated above, it is extremely ineffective or useless to use the dynamic range of the signal as the range of the allowed noise level because the allowed noise level is always lower than the signal level by the predetermined level. Moreover, using the same range is disadvantageous in terms of the number of bits required. Accordingly, this embodiment uses a quantization table such that range of the allowed noise level is shifted downwards by the predetermined level from the signal level in the critical band. In this way, the allowed noise level can be represented using fewer bits. In other words, shifting the range of the allowed noise level allows fewer bits to be used to represent the allowed noise level with a given resolution than the number of bits required with no shift. Accordingly, it is possible to reduce the number of bits for required to represent the allowed noise level.

In a further aspect of the invention, when a critical band is divided into blocks, and a floating coefficient for each block and the word length for one of the blocks is included in the compressed signal, the accuracy of the expansion can be increased by including additional bits in the compressed signal to aid in calculating the allowed noise level. In the expansion process, a difference between the calculated noise level calculated from the floating coefficient and the word length and the allowed noise level arises because of the quantization of the floating coefficient and the word length. To reduce this error, judgment bits are included in the compressed signal indicating the difference between the allowed noise level NL of each block and the calculated noise level.

The judgment bits consist of, e.g., 2 bits, and indicate a correction of the calculated noise levels of the respective blocks within a range of about +3 dB to bring the calculated noise level closer to the allowed noise level. For example, when the judgment bits are "00", the calculated noise level is increased by a predetermined amount; when the judgment bits are "01", the calculated noise level is left unchanged; and when the judgment bits are "10", the calculated noise level is decreased by the predetermined amount. It is to be noted that "11" is not used, or indicates that the calculated noise level is not changed.

Thus, the calculated noise level of the block b1 is determined from the floating coefficient Fc1 and the word length W1. Then, the difference between the allowed noise level NL and the calculated noise level indicated by the judgment bits is added to the calculated noise level, thereby making it possible to provide a level closer to the allowed noise level.

Since the calculated noise levels of the respective blocks b1 through b4 are not changed beyond the level of the adjacent calculated noise level, it is possible to determine respective word lengths W2 through W4 from the respective floating coefficients Fc2 through Fc4.

The manner in which the method reduces number of bits in the example of FIG. 1A is shown by comparing Table 4 with Table 1.

TABLE 4

| NO. OF BLOCKS IN CRITICAL BAND | 1 | 2 | 3 | 4 |
|---|---|---|---|---|
| FLOATING COEFFICIENTS | 6 | 6 × 2 | 6 × 3 | 6 × 4 |
| WORD LENGTH | 4 | 4 | 4 | 4 |
| JUDGMENT BITS | (2) | 2 | 2 | 2 |
| TOTAL | 10 | 18 | 24 | 30 |
| NO. OF BITS AS PERCENTAGE OF NO. OF BITS IN TABLE 1 | 100 | 90 | 80 | 75 |

In Table 4, when the critical band B is divided into a single block, a total of 10 bits of subinformation are required, 6 bits for the floating coefficient and 4 bits for the word length W. No judgment bits are used in this case. When the critical band B is divided into two blocks, a total of 18 bits are required, 6×2=12 bits for the floating coefficient, 4 bits for the word length W, and 2 judgment bits. When the critical band is divided into three blocks, a total of 24 bits are required, 6×3=18 bits for the floating coefficient, 4 bits for the word length W, and 2 judgment bits. Finally, when the critical band is divided into four blocks, (the example shown in FIG. 1A), a total of 30 bits is required, 6×4=24 bits for the floating coefficient, 4 bits for the word length W, and 2 judgment bits.

Compared with the bit requirements of the corresponding examples shown in Table 1, when the critical band is divided into one block the bit requirement shown in Table 4 is the same as that in Table 1. As the number of blocks increases, the bit requirement is reduced such that the bit requirement is 90% when the number of blocks is 2, the bit requirement is 80% when the number of blocks is 3, and the bit requirement is 75% when the number of blocks is 4. Accordingly, it can be seen that the method of this aspect of the invention is very effective in reducing the number of bits of subinformation required.

It is to be noted that, in the aspects of the invention described above, the range of the allowed noise level NL is smaller than the dynamic range of the signal. Since the minimum value of the signal-to-noise ratio is about 30 dB, there is no possibility that the allowed noise level can be greater than 30 dB below the peak value of the dynamic range of the signal. This can be allowed for in the compressor.

Figure 3:
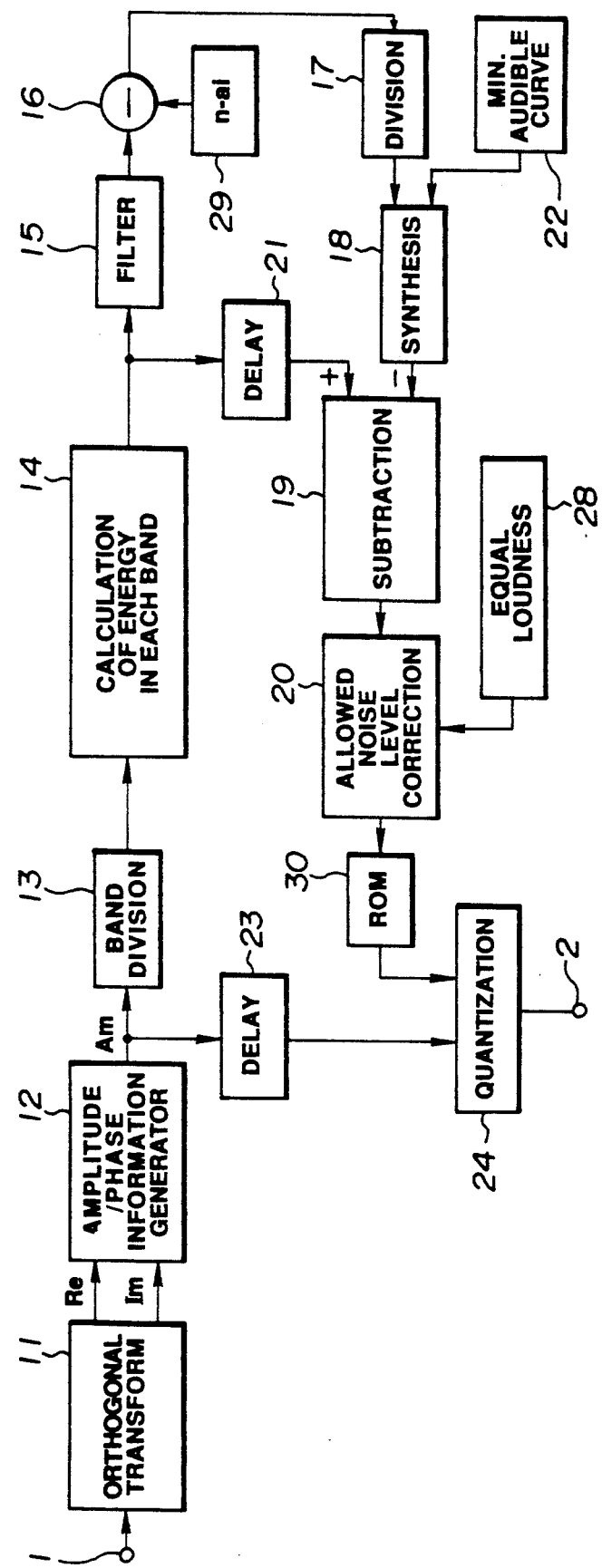
FIG. 3 is a block diagram showing a practical configuration for determining the allowable noise level.

An example of the configuration of a compressor to which the method of this invention is applied is shown in FIG. 3. The compressor determines the above-described allowed noise levels and quantizes signals using a number of bits allocated based on the allowed noise levels.

In FIG. 3, a digital audio signal in the time domain delivered to the input terminal 1 is fed into the orthogonal transform circuit 11. In the orthogonal transform circuit 11, the digital audio signal is divided in time into blocks, each of which is transformed into a set of coefficients in the frequency domain. Coefficients comprising a real component value Re and an imaginary component value Im are provided. These coefficients are fed into the amplitude phase/information generator 12 where amplitude information Am and phase information Ph are derived as spectral components from the real component value Re and the imaginary component value Im. The human sense of hearing is sensitive to amplitude in the frequency domain, but is relatively insensitive to phase. Accordingly, only the amplitude information from the amplitude/phase information generator is used to allocate the number of quantizing bits.

The set of amplitude information Am resulting from orthogonally transforming a block of the input signal is fed into the band divider 13, which divides the set into critical bands. A critical band takes account of the frequency resolution characteristic of the human sense of hearing. For example, the frequency range of 0 Hz to 22 kHz is divided into 25 critical bands having a bandwidth that increases with increasing frequency of the band. The human sense of hearing has a frequency resolution characteristic similar to a set of band-pass filters that define a set of frequency bands corresponding to the critical bands.

Figure 4:
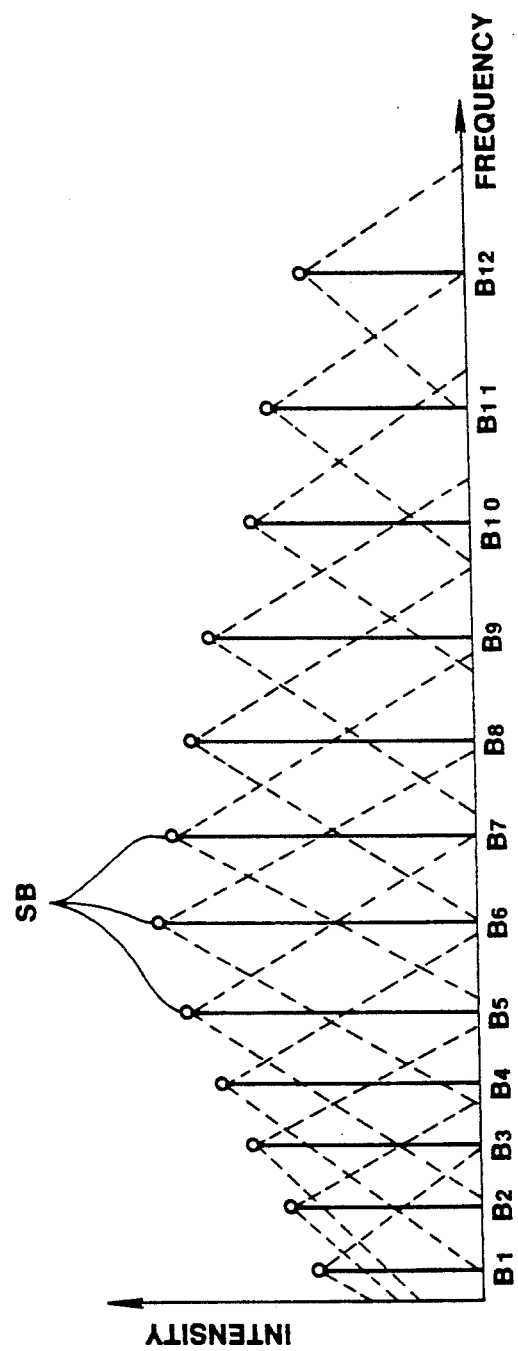
FIG. 4 shows a bark spectrum.

The amplitude information Am divided into critical bands is fed from the band divider 13 into the energy calculating circuit 14. The energy calculating circuit calculates the energy in each critical band by summing the peaks, averages or energies of amplitude information Am in each band. The output of the energy calculating circuit, i.e., a spectrum of energy of each band, is generally called a bark spectrum. An example of a bark spectrum SB is shown in FIG. 4. To simplify FIG. 4, only twelve critical bands, B1 through B12, are shown.

The masking effect of the bark spectrum SB is determined by applying convolution processing to the bark spectrum using a predetermined weighting function To realize this, the output from the energy calculating circuit 14, i.e., the respective values of the bark spectrum SB, are sent to the filter circuit 15. In the filter circuit 15, e.g., plural delay elements sequentially delay input data. Plural multipliers (e.g., 25 multipliers, one for each band) each multiply the output of a delay element by a weighting coefficient. Finally, an adder sums the outputs of the multipliers.

The multipliers in the filter circuit 15 carry out a multiplying operation. For example, if the multiplier M corresponds to an arbitrary band, the outputs of respective delay elements are multiplied by 0.000086, 0.0019, 0.15, 1, 0.4, 0.06, and 0.007 by the multipliers M−3, M−2, M−1, M, M+1, M+2, and M+3, respectively. M is an arbitrary integer between 1 and 25. In this way, convolution processing of the bark spectrum SB is carried out to determine the sum of the portions indicated by dotted lines in FIG. 4.

The term "masking" refers to the psychoacoustic phenomenon by which a signal can be rendered inaudible by an other signal. This signal is said to be "masked" by the other signal. Masking takes place both in the time domain and in the frequency domain. As a result of masking, noise that is subject to masking will not be heard. Accordingly, noise that is subject to masking in an audio signal is considered as allowed noise.

The output of the filter circuit 15 is sent to the subtracter 16. The subtracter 16 determines the level $\alpha$ in the convoluted region corresponding to the allowed noise level. The level $\alpha$ corresponding to the allowed noise level is that level that will correspond to the allowed noise level in each critical band after carrying out the deconvolution processing to be described below. An allowed function, which represents the masking level, for determining the level $\alpha$ is delivered to the subtracter 16 from the function generator 29, which will be described next. Increasing or decreasing the allowed function controls the level $\alpha$.

If the number of a given critical band is i, the number of the lowest frequency critical band being 1, the level $\alpha$ corresponding to the allowed noise level is determined by the following equation:

$$\alpha = S - (n - ai)$$

where n and a are constants, and S in intensity of the convolution-processed bark spectrum. In the above equation, $(n - ai)$ represents the allowed function. In this embodiment, n is set to 38 and a is set to 1. This provides an acceptable sound quality. c The level $\alpha$ is fed into the divider 17, which applies deconvolution to the level $\alpha$ in the convoluted region. Carrying out deconvolution provides a masking spectrum from the level $\alpha$. This masking spectrum becomes the allowed noise spectrum. It is to be noted that although deconvolution normally requires complicated processing, deconvolution is carried out in this embodiment using the divider 17.

Figure 5:
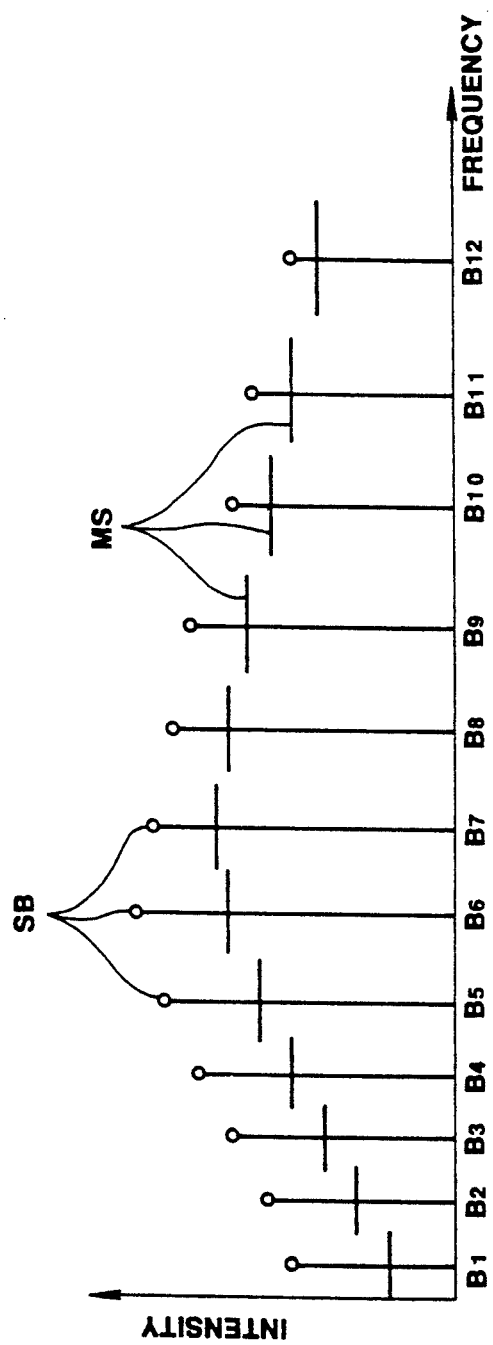
FIG. 5 shows a masking spectrum.

The masking spectrum is fed into the subtracter 19 through the synthesis circuit 18. The output of the energy calculating circuit 14, i.e., the bark spectrum SB, is also fed into the subtracter 19 through the delay circuit 21. The subtracter 19 performs a subtractive operation between the masking spectrum and the bark spectrum SB. Thus, as shown in FIG. 5, the portion of the bark spectrum SB with a level lower than the level of the masking spectrum MS is subjected to masking.

The output of the subtracter 19 is delivered to the ROM 30 through the allowed noise level corrector 20. The ROM 30 stores plural allocations of numbers of bits for quantizing the amplitude information Am. The ROM 30 provides an allocation of numbers of bits corresponding to the output of the subtracter 19, i.e., the level difference between energy in each band and the masking level. The quantizer 24 quantizes the amplitude information Am using the numbers of bits allocated. The output of the quantizer 24 is fed to the output terminal 2.

The delay circuit 21 is provided to delay the bark spectrum SB from the energy calculating circuit 14 to take account of delays in the circuits preceding the subtracter 19. The delay circuit 23 is provided to delay the amplitude information Am to take account of delays in the circuits preceding the quantizing circuit 24.

Figure 6:
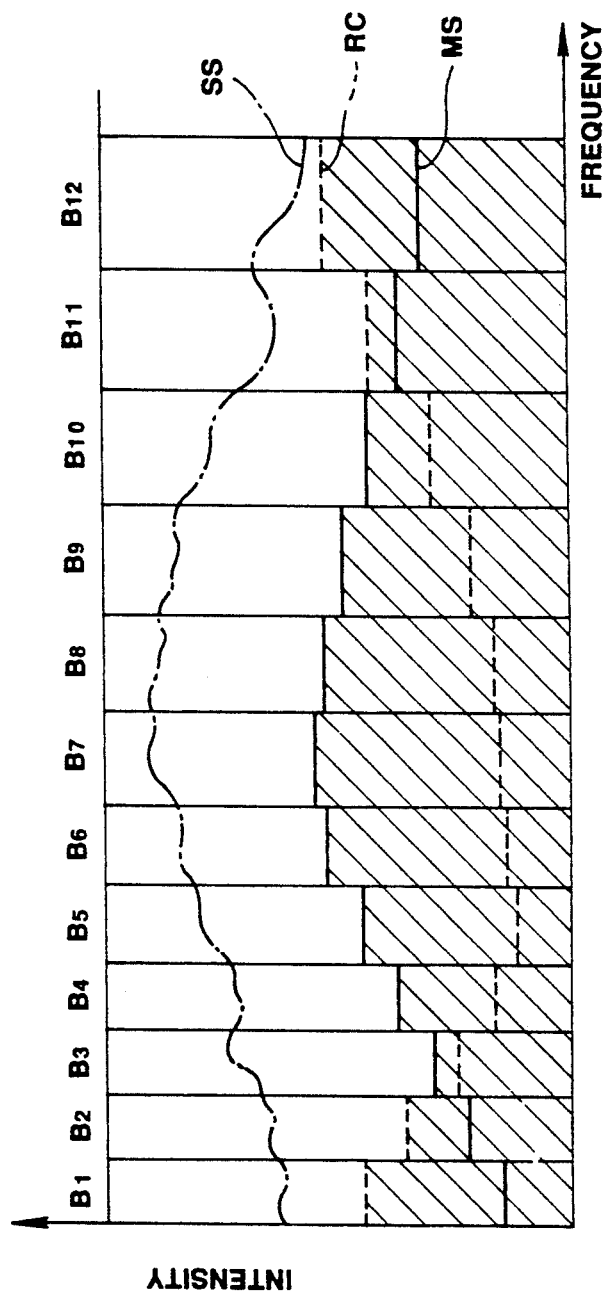
FIG. 6 shows a minimum audible level curve synthesized with a masking spectrum.

The synthesis circuit 18 may additionally synthesize the masking spectrum MS with data indicating the minimum audible level curve RC, as shown in FIG. 6. The minimum audible level curve is yet another characteristic of the human sense of hearing, and is provided by the minimum audible curve generator 22. According to minimum audible level curve, noise having an absolute level below the minimum audible level curve cannot be heard. For a given quantization, the minimum audible level curve varies depending on, e.g., the loudness level when the signal is reproduced. However, because of the manner in which music fits within the dynamic range of practical 16-bit digital systems, if quantizing noise is inaudible in the frequency band to which the ear is most sensitive, i.e., the frequency band in the vicinity of 4 kHz, it can be assumed that quantizing noise less than the level of the minimum audible level curve will not heard in other frequency bands. Accordingly, when the quantizing noise level in the vicinity of 4 kHz corresponding to the word length set by the system is not heard, the allowed noise level can be provided by synthesizing the minimum audible level curve RC and the masking spectrum MS. The resulting allowed noise level in each critical band may be up to the level indicated by the cross-hatched portion in FIG. 6. In this embodiment, the level of the minimum audible level curve at 4 kHz is set to correspond to the minimum level corresponding to quantizing using, e.g., 20 bits. FIG. 6 also shows the signal spectrum SS.

The allowed noise level correction circuit 20 corrects the allowed noise level from the subtracter 19 using correction value information defining the equi-loudness curve fed into the allowed noise level correction circuit by the correction value determination circuit 28. This takes account of the equi-loudness curve.

The equi-loudness curve is yet another characteristic of the human sense of hearing. This curve is derived by determining the sound pressure levels at various frequencies that can be heard at the same intensity as that of a pure sound at 1 kHz. The equi-loudness curve is substantially similar to the minimum audible curve RC shown in FIG. 6. According to the equi-loudness curve, a sound in the vicinity of 4 kHz is heard with the same intensity as that of a sound at 1 kHz when the 4 kHz sound has a sound pressure level 8 to 10 dB lower than the 1 kHz sound. On the other hand, a sound in the vicinity of 50 Hz must have a sound pressure level of about 15 dB greater than the sound pressure level of a 1 kHz sound to be heard at the same intensity. For this reason, noise above the level of the minimum audible level curve should have a frequency characteristic given by a curve corresponding to the equi-loudness curve. It can be seen that adapting to the characteristic of the human sense of hearing requires correcting the allowed noise level by taking the equi-loudness curve into consideration.

In an alternative embodiment, synthesis processing of the minimum audible curve is omitted, and the minimum audible curve generator 22 and synthesis circuit 18 are not required. The output from the subtracter 16 is deconvoluted by the divider 17, and is then fed directly to the subtracter 19.

Although illustrative embodiments of the invention have been described herein in detail, it is to be understood that the invention is not limited to the precise embodiments described, and that various modifications may be practiced within the scope of the invention defined by the appended claims.

What is claimed is:

1. A method for compressing a digital input signal to provide a compressed signal, the method comprising the steps of:

deriving spectral components from the digital input signal;

dividing the spectral components into critical bands;

dividing the spectral components in a critical band into blocks having a bandwidth narrower than the critical band;

applying block floating processing to the blocks to generate a floating coefficient for each block;

quantizing the spectral components in each block using a number of bits allocated to the block according to an allowed noise level for the critical band, the number of bits allocated being indicated by a word length; and including in the compressed signal the word length for each block, and, instead of the floating coefficient for each block, the allowed noise level for the critical band.

2. The method of claim 1, wherein, in the step of deriving spectral components from the digital input signal, the spectral components are derived by orthogonally transforming the digital input signal using a discrete cosine transform (DCT).

3. The method of claim 1, wherein, in the step of dividing the spectral components into critical bands, spectral components in a frequency range of 0 Hz to 22 kHz are divided into 25 critical bands having a bandwidth that broadens with increasing frequency of the critical band.

4. The method of claim 1, wherein:

the step of quantizing the spectral components in each block includes the steps of:

calculating the allowed noise level from the spectral components, and calculating a magnitude for each block from the spectral components in the block; and in the step of quantizing the spectral components in each block, the number of bits is allocated according to a level difference between the magnitude for the block and the allowed noise level.

5. The method of claim 4, wherein:

the step of deriving spectral components from the digital input signal provides spectral components having amplitude information and phase information; and the step of calculating a magnitude for each block calculates the magnitude by summing the amplitude information of the spectral components in the block.

6. The method of claim 5, wherein the step of calculating the allowed noise level includes the steps of:
   calculating a magnitude for each critical band by summing the amplitude information of the spectral components in each respective critical band; and
   convoluting the magnitude for each critical band with a predetermined weighting function to take account of masking.

7. The method of claim 1, wherein, in the including step:
   the allowed noise level included in the compressed signal is coarsely quantized; and
   additional bits for each block are included in the compressed signal to finely quantize the allowed noise level.

8. The method of claim 7, wherein, in the including step:
   the allowed noise level included in the compressed signal is coarsely quantized using a first number of bits; and
   a second number of additional bits for each block is included in the compressed signal to finely quantize the allowed noise level.

9. The method of claim 7, wherein, in the including step:
   the first number of bits is four; and
   the second number of bits is two.

10. The method of claim 7, wherein, in the including step, the coarse quantizing and the fine quantizing of the allowed noise level are logarithmic.

11. A method for compressing a digital input signal to provide a compressed signal, the method comprising the steps of:
    deriving spectral components from the digital input signal;
    dividing the spectral components into critical bands;
    dividing the spectral components into a block having a bandwidth corresponding to plural critical bands;
    applying block floating processing to the block to generate a floating coefficient; and
    quantizing the spectral components in each critical band using an adaptively-allocated number of bits.

12. The method of claim 11, wherein, in the step of deriving spectral components from the digital input signal, the spectral components are derived by orthogonally transforming the digital input signal using a discrete cosine transform (DCT).

13. The method of claim 11, wherein, in the step of dividing the spectral components into critical bands, spectral components in a frequency range of 0 Hz to 22 kHz are divided into 25 critical bands having a bandwidth that broadens with increasing frequency of the critical band.

14. The method of claim 13, wherein, in the step of dividing the spectral components into a block having a bandwidth corresponding to plural critical bands, the spectral components in the block are at low frequencies in the frequency range.

15. The method of claim 11, wherein:
    in the step of quantizing the spectral components in each critical band using an adaptively-allocated number of bits, the adaptively-allocated number of bits is indicated by a word length; and
    the method additionally comprises the step of including in the compressed signal the floating coefficient for the block as the only floating coefficient for the critical bands in the block, and the word length for each critical band in the block.

16. The method of claim 15, wherein the step of quantizing the spectral components comprises the steps of:
    calculating a magnitude for each critical band from the spectral components in the critical band;
    calculating an allowed noise level for each critical band from the spectral components; and
    calculating the adaptively-allocated number of bits for each critical band from a level difference between the magnitude for the critical band and the allowed noise level for the critical band.

17. The method of claim 15, wherein:
    the step of deriving spectral components from the digital input signal provides spectral components having amplitude information and phase information; and
    the step of calculating a magnitude for each critical band calculates the magnitude by summing the amplitude information of the spectral components in the critical band.

18. The method of claim 17, wherein the step of quantizing the spectral components includes the step of convoluting the magnitude of each critical band with a predetermined weighting function to take account of masking.

19. A method for compressing a digital input signal to provide a compressed signal, the method comprising the steps of:
    deriving spectral components from the digital input signal;
    dividing the spectral components into critical bands;
    dividing the spectral components in a critical band into blocks having a bandwidth narrower than the critical band;
    applying block floating processing to the blocks to generate a floating coefficient for each block; and
    quantizing the spectral components in each block using an adaptively-allocated number of bits.

20. The method of claim 19, wherein, in the step of deriving spectral components from the digital input signal, the spectral components are derived by orthogonally transforming the digital input signal using a discrete cosine transform (DCT).

21. The method of claim 19, wherein, in the step of dividing the spectral components into critical bands, spectral components in a frequency range of 0 Hz to 22 kHz are divided into 25 critical bands having a bandwidth that broadens with increasing frequency of the critical band.

22. The method of claim 21, wherein, in the step of dividing the spectral components in a critical band into a blocks having a bandwidth narrower than the critical band, the critical band is at a high frequency in the frequency range.

23. The method of claim 19 wherein:
    in the step of quantizing the spectral components in each block using an adaptively-allocated number of bits, the adaptively-allocated number of bits is indicated by a word length; and
    the method additionally comprises the step of including in the compressed signal the word length for one of the blocks in the critical band as the only word length for the blocks in the critical band.

24. The method of claim 23, wherein the step of quantizing the spectral components in each block comprises the steps of:
   calculating an allowed noise level for the critical band from the spectral components;
   calculating a magnitude for each block from the spectral components in the block; and
   calculating the adaptively-allocated number of bits for each block according to a level difference between the magnitude of the block and the allowed noise level.

25. The method of claim 24, wherein:
   the step of deriving spectral components from the digital input signal provides spectral components having amplitude information and phase information; and
   the step of calculating a magnitude for each block calculates the magnitude by summing the amplitude information of the spectral components in the block.

26. The method of claim 25, wherein the step of calculating the allowed noise level includes the steps of:
   calculating a magnitude for each critical band by summing the amplitude information of the spectral components in each respective critical band; and
   convoluting the magnitude of each critical band with a predetermined weighting function to take account of masking.

27. A method for compressing a digital input signal to provide a compressed signal, the method comprising the steps of:
   deriving spectral components from the digital input signal;
   dividing the spectral components into critical bands;
   dividing the spectral components in a critical band into blocks having a bandwidth narrower than the critical band;
   applying block floating processing to the blocks to generate a floating coefficient for each block;
   quantizing the spectral components in each block using a number of bits allocated to the block according to an allowed noise level for the critical band, the number of bits allocated being indicated by a word length; and
   including the compressed signal, instead of the floating coefficient for each block, the allowed noise level with a range that is shifted downwards in level by a predetermined level from a signal level range in the critical band.

28. The method of claim 27, wherein, in the step of deriving spectral components from the digital input signal, the spectral components are derived by orthogonally transforming the digital input signal using a discrete cosine transform (DCT).

29. The method of claim 27, wherein, in the step of dividing the spectral components into critical bands, spectral components in a frequency range of 0 Hz to 22 kHz are divided into 25 critical bands having a bandwidth that broadens with increasing frequency of the critical band.

30. The method of claim 27, wherein:
   the step of quantizing the spectral components in each block includes the steps of:
      calculating the allowed noise level from the spectral components, and
      calculating a magnitude for each block from the spectral components in the block; and
   in the step of quantizing the spectral components in each block, the number of bits is allocated according to a level difference between the magnitude for the block and the allowed noise level.

31. The method of claim 30, wherein:
   the step of deriving spectral components from the digital input signal provides spectral components having amplitude information and phase information; and
   the step of calculating a magnitude for each block calculates the magnitude by summing the amplitude information of the spectral components in the block.

32. The method of claim 31, wherein the step of calculating the allowed noise level includes the steps of:
   calculating a magnitude for each critical band by summing the amplitude information of the spectral components in each respective critical band; and
   convoluting the magnitude for each critical band with a predetermined weighting function to take account of masking.

33. An apparatus for compressing a digital input signal to provide a compressed signal, the apparatus comprising:
   an orthogonal transform circuit whereto the input signal is connected;
   means for dividing spectral components from the orthogonal transform circuit into critical bands;
   means for dividing the spectral components in a critical band into blocks having a bandwidth narrower than the critical band;
   means for applying block floating processing to the blocks to generate a floating coefficient for each block;
   means for quantizing the spectral components in each block using a number of bits allocated to the block according to an allowed noise level for the critical band, the number of bits being indicated by a word length; and
   means for including in the compressed signal the word length for each block, and, instead of the floating coefficient for each block, the allowed noise level for the critical band.

34. The apparatus of claim 33, wherein orthogonally transform circuit includes a discrete cosine transform (DCT) circuit.

35. The apparatus of claim 34, wherein, the means for dividing the spectral components from the orthogonal transform circuit into critical bands divides spectral components in a frequency range of 0 Hz to 22 kHz into 25 critical bands having a bandwidth that broadens with increasing frequency of the critical band.

36. The apparatus of claim 33, wherein:
   the means for quantizing the spectral components in each block includes means for:
      calculating the allowed noise level from the spectral components, and
      calculating a magnitude for each block from the spectral components in the block; and
   the means for quantizing the spectral components in each block allocates the number of bits to each block according to a level difference between the magnitude for the block and the allowed noise level.

37. The apparatus of claim 36, wherein:
   the spectral components from the orthogonal transform circuit include amplitude information and phase information; and the means for calculating a magnitude for each block calculated the magnitude by summing the amplitude information of the spectral components in the block.

38. The apparatus of claim 37, wherein the means for calculating the allowed noise level includes means for:

calculating a magnitude for each critical band by summing the amplitude information of the spectral components in each respective critical band; and convoluting the magnitude for each critical band with a predetermined weighting function to take account of masking.

39. The apparatus of claim 33, wherein:

the allowed noise level included in the compressed signal is coarsely quantized using a first number of bits; and the including means is additionally for including in the compressed signal a second number of additional bits for each block to finely quantize the allowed noise level.

40. The apparatus of claim 30, wherein:

the allowed noise level included in the compressed signal is coarsely quantized using a first number of bits; and the including means is additionally for including in the compressed signal a second number of additional bits for each block to finely quantize the allowed noise level.

41. The apparatus of claim 40, wherein:

the first number of bits is four; and the second number of bits is two.

42. The apparatus of claim 33, wherein the coarse quantization and the fine quantization of the allowed noise level are logarithmic.

43. An apparatus for compressing a digital input signal to provide a compressed signal, the apparatus comprising:

an orthogonal transform circuit whereto the digital input signal is connected;

means for dividing spectral components from the orthogonal transform circuit into critical bands;

means for dividing the spectral components into a block having a bandwidth corresponding to plural critical bands;

means for applying block floating processing to the block to generate a block floating coefficient; and means for quantizing the spectral components in each critical band using an adaptively-allocated number of bits.

44. The apparatus of claim 43, wherein the orthogonal transform circuit includes a discrete cosine transform (DCT) circuit.

45. The apparatus of claim 43, wherein the means for dividing the spectral components from the orthogonal transform circuit into critical bands divides spectral components in a frequency range of 0 Hz to 22 kHz into 25 critical bands having a bandwidth that broadens with increasing frequency of the critical band.

46. The apparatus of claim 45, wherein the critical bands in the block are at low frequencies in the frequency range.

47. The apparatus of claim 43, wherein:

the adaptively-allocated number of bits used by the means for quantizing the spectral components in each critical band is indicated by a word length; and the apparatus additionally comprises a means for including in the compressed signal the floating coefficient for the block as the only floating coefficient for the critical bands in the block, and the work length for each critical band in the block.

48. The apparatus of claim 47, wherein the means for quantizing the spectral components in each critical band comprises means for:

calculating a magnitude for each critical band from the spectral components in the critical band;

calculating an allowed noise level for each critical band from the spectral components from the orthogonal transform circuit; and calculating the adaptively-allocated number of bits for each critical band from a level difference between the magnitude of the critical band and the allowed noise level of the critical band.

49. The apparatus of claim 47, wherein:

the spectral components from the orthogonal transform circuit include amplitude information and phase information; and the means for calculating a magnitude for each critical band calculates the magnitude by summing the amplitude information of the spectral components in the critical band.

50. The apparatus of claim 49, wherein the means for quantizing the spectral components in each critical band includes a means for convoluting the magnitude of each critical band with a predetermined weighting function to take account of masking.

* * * * *